(12) United States Patent
Abe et al.

(10) Patent No.: US 7,816,711 B2
(45) Date of Patent: Oct. 19, 2010

(54) SOLID-STATE IMAGING DEVICE

(75) Inventors: Takashi Abe, Kanagawa (JP); Ryoji Suzuki, Kanagawa (JP); Keiji Mabuchi, Kanagawa (JP); Testuya Iizuka, Kanagawa (JP); Takahisa Ueno, Kanagawa (JP); Tsutomu Haruta, Kanagawa (JP)

(73) Assignee: Sony Corporation, Tokyo (JP)

( * ) Notice: Subject to any disclaimer, the term of this patent is extended or adjusted under 35 U.S.C. 154(b) by 185 days.

(21) Appl. No.: 11/824,088

(22) Filed: Jun. 29, 2007

(65) Prior Publication Data

US 2008/0210947 A1  Sep. 4, 2008

Related U.S. Application Data

(63) Continuation of application No. 10/979,707, filed on Nov. 2, 2004, now Pat. No. 7,485,903.

(30) Foreign Application Priority Data

Nov. 5, 2003  (JP) .............................. 2003-375202

(51) Int. Cl.
 *H01L 31/062* (2006.01)
(52) U.S. Cl. ...................... 257/291; 257/294
(58) Field of Classification Search ................. 257/291, 257/292, 294
See application file for complete search history.

(56) References Cited

U.S. PATENT DOCUMENTS

| 6,974,718 | B2 | 12/2005 | Agarwal |
| 7,016,089 | B2 | 3/2006 | Yoneda et al. |
| 7,112,466 | B2 | 9/2006 | Mann |
| 7,485,903 | B2 * | 2/2009 | Abe et al. ............... 257/222 |
| 2001/0012133 | A1 | 8/2001 | Yoneda et al. |
| 2002/0093015 | A1 * | 7/2002 | Furumiya et al. ......... 257/53 |

FOREIGN PATENT DOCUMENTS

| JP | 62-206878 | 11/1987 |
| JP | 06-339081 | 12/1994 |
| JP | 2001-218073 | 8/2001 |
| JP | 2001-230400 | 8/2001 |
| JP | 2001-332714 | 11/2001 |
| JP | 2003-258230 | 9/2003 |

\* cited by examiner

*Primary Examiner*—Mark Prenty
(74) *Attorney, Agent, or Firm*—Robert J. Depke; Rockey, Depke & Lyons, LLC

(57) ABSTRACT

A solid-state imaging device having an arrangement in which well contact is achieved for each pixel is provided. In the solid-state imaging device, a well contact part is formed in an activation region of a photoelectric conversion portion. The well contact part fixes a well in which the photoelectric conversion portion and transistors of the pixel are provided at a predetermined potential.

4 Claims, 15 Drawing Sheets

FIG. 10

| A1 | A2 | A3 |
|----|----|----|
| A4 | B1 | A5 |
| A6 | A7 | A8 |
| A9 | B2 | A10 |
| A11 | A12 | A13 |

B1=(A1+A2+ · · · +A8)/8

B2=(A6+A7+ · · · +A13)/8

SOLID-STATE IMAGING DEVICE

The subject matter of application Ser. No. 10/979,707, is incorporated herein by reference. The present application is a continuation of U.S. Ser. No. 10/979,707, filed Nov. 2, 2004, now U.S. Pat. No. 7,485,903, issued Feb. 3, 2009, which claims priority to Japanese Patent Application No. JP 2003-375202 filed Nov. 5, 2003. The present application claims priority to these previously filed applications.

BACKGROUND OF THE INVENTION

1. Field of the Invention

The present invention relates to solid-state imaging devices, and more particularly, to a solid-state imaging device, such as a complementary metal-oxide semiconductor (CMOS) image sensor including amplifying elements for respective pixels.

2. Description of the Related Art

Solid-state imaging devices need a great number of pixels arranged in a two-dimensional array fashion in a pixel array area. For example, in known CMOS image sensors, each element of a pixel is disposed in a well and the well is electrically fixed to the periphery of the pixel array area.

FIG. 12 is a circuit diagram showing an example of the arrangement of a unit pixel 100. As shown in FIG. 12, the unit pixel 100 includes a photoelectric conversion portion 101, a transfer transistor 102, an amplifying transistor 103, a reset transistor 104, and a selection transistor 105. The anode of the photoelectric conversion portion 101 is grounded. The photoelectric conversion portion 101 photo-electrically converts incident light into an electric charge of an electron (or a positive hole) corresponding to the amount of the incident light to be accumulated. The source of the transfer transistor 102 is connected to the cathode of the photoelectric conversion portion 101, and the gate of the transfer transistor 102 is connected to a transfer signal wire 106. Also, the drain of the transfer transistor 102 is connected to a gate input 107 of the amplifying transistor 103. When the potential of the transfer signal wire 106 becomes the potential of a power supply wire 108 (hereinafter, referred to as an "H" level), the transfer transistor 102 transfers the electric charge accumulated in the photoelectric conversion portion 101 to the gate input 107 of the amplifying transistor 103.

The gate of the amplifying transistor 103 is connected to the gate input 107, and the drain of the amplifying transistor 103 is connected to the power supply wire 108. Also, the source of the amplifying transistor 103 is connected to the drain of the selection transistor 105. The amplifying transistor 103 outputs a voltage corresponding to the electric charge that is transferred by the transfer transistor 102 from the photoelectric conversion portion 101 to the gate input 107 to the source side. The source of the reset transistor 104 is connected to the gate input 107 of the amplifying transistor 103, and the drain of the reset transistor 104 is connected to the power supply wire 108. Also, the gate of the reset transistor 104 is connected to a reset signal wire 109. When the potential of the reset signal wire 109 becomes the "H" level, the potential of the gate input 107 is reset to the potential of the power supply wire 108, which is a power supply voltage.

The drain of the selection transistor 105 is connected to the source of the amplifying transistor 103, and the gate of the selection transistor 105 is connected to a selection signal wire 110. Also, the source of the selection transistor 105 is connected to a pixel output line 111. When the potential of the selection signal wire 110 becomes the "H" level, the selection transistor 105 is turned on and allows conduction between the source of the amplifying transistor 103 and the pixel output line 111. Pixels for respective rows are connected to the pixel output line 111 in parallel. The gate of a transistor 112 connected at an end of the pixel output line 111 is biased at a constant voltage by a bias power supply 113, and the transistor 112 operates as a constant current source. When the selection transistor 105 of a pixel is turned on, the amplifying transistor 103 and the constant-current transistor 102 function as a source follower. Thus, a voltage that has a predetermined potential difference from the potential of the gate input 107 of the amplifying transistor 103 is output to the pixel output line 111.

FIG. 13 is a plan pattern view showing a pixel structure of the unit pixel 100. Referring to FIG. 13, a gate electrode 201 is disposed between a photoelectric conversion region (activation region) 202 and an activation region 203 of the photoelectric conversion portion 101, and constitutes the transfer transistor 102. The activation region 203 is a drain region of the transfer transistor 102, a source region of the reset transistor 104, and the gate input 107 of the amplifying transistor 103. A gate electrode 204 is disposed between the activation region 203 and an activation region 205, and constitutes the reset transistor 104. The activation region 205 is a drain region of the reset transistor 104 and a drain region of the amplifying transistor 103.

A gate electrode 206 is disposed between the activation region 205 and an activation region 207, and constitutes the amplifying transistor 103. The activation region 207 is a source region of the amplifying transistor 103 and a drain region of the selection transistor 105. A gate electrode 208 is disposed between the activation region 207 and an activation region 209, and constitutes the selection transistor 105. The activation region 209 is a source region of the selection transistor 105, and is electrically connected to the pixel output line 111, which is a metallic wire, at a contact part 210.

The gate electrodes 201, 204, 206, and 208 are, for example, polysilicon electrodes. The activation region 203 and the gate electrode 206 are electrically connected to each other via a metallic wire 213 at contact parts 211 and 212. The activation region 205 is connected to a power supply via a metallic line (not shown) at a contact part 214. Although wires extending in the row direction (the lateral direction in the drawing), that is, the transfer signal wire 106, the reset signal wire 109, and the selection signal wire 110 are not illustrated in FIG. 13, the gate electrodes 201, 204, and 208 are electrically connected to the transfer signal wire 106, the reset signal wire 109, and the selection signal wire 110, respectively.

Although not illustrated in FIG. 13, with the pixel structure of the unit pixel 100 as described above, the base of each of the transistors 102, 103, 104, and 105 is connected to a P-well. Also, the photoelectric conversion portion 101 has an arrangement in which an N-type impurity-doped region is covered by a P-type impurity region formed above thereof and a P-well. Such P-regions have the same potential and are at a ground level. A well contact part and a ground wire for fixing the P-well at the ground level have been disposed at the periphery of the pixel array area. This is because that a well contact part is not disposed inside a pixel array area in order to extremely reduce the size of a pixel although a well contact part is normally disposed near each transistor.

However, for the structure in which a well contact part is disposed only at the periphery of the pixel array area, if an increase in the number of pixels increases the dimensions of P-wells of a pixel array area, it is difficult to fix the intermediate portion of the P-wells at a ground potential. Thus, the following problems occur.

A transistor has a different threshold between the center and periphery of a pixel array area.

Since a photoelectric conversion portion of a type in which an N-type impurity region is covered by a P-type impurity region exhibits a different potential level of the P-type impurity region between the center and periphery of the pixel array area, a difference between the center and periphery of the pixel array area also appears in the saturation level.

When each pixel is driven, a variation in the potential of a doped layer connected to a pixel output line and the like in the pixel being driven causes a variation in a potential itself of a well due to a coupling capacitance of the doped layer and the well. Thus, when all the pixels are driven at the same time or when the number of pixels is large, the variation in the well potential due to the coupling capacitance is not negligible at a portion near the center of the pixel array area where pressure of the well potential is electrically weak.

In order to electrically fix the well potential further firmly and to solve the above problems, a solid-state imaging device enabling well contact for each pixel has been suggested (for example, see Japanese Unexamined Patent Application Publication No. 2001-332714). FIG. 14 is a plan pattern view showing a pixel structure providing a well contact part for each pixel. In FIG. 14, parts equivalent to those in FIG. 13 are represented by the same reference numerals.

As shown in FIG. 14, cutting off part of the activation region 202, which is a photoelectric conversion region, of the unit pixel 100 ensures an activation region 221 for achieving well contact. The activation region 221, which is a well contact part, is electrically connected to a metallic wire 222 that supplies a ground potential and that extends in the vertical direction (the longitudinal direction in the drawing) at a contact part 223. The other parts are similar to those in FIG. 13.

FIG. 15 is a sectional view taken along the line XV-XV of FIG. 14. In FIG. 15, parts equivalent to those in FIG. 14 are represented by the same reference numerals. In the example shown in FIG. 15, a P-well 302 is disposed in an N-substrate 301, and the photoelectric conversion portion 101 and the transistors 102 to 105 of the pixel are disposed in the P-well 302. An N-region 303 is an activation region (the activation region 203 in FIG. 14) connected to the gate electrode 206 of the amplifying transistor 103 via the metallic wire 213 at the contact part 211.

The activation region 202 includes an N-type impurity region 304, a P+ region 305 near the surface of the N-type impurity region 304, and a P-well 302 peripheral to the N-type impurity region 304. A P+ region 306 is connected to the metallic wire 222 via the doped layer and the contact part 223 in that order, and fixes the potential of the P-well 302 at the ground potential via the metallic wire 222. Element separation regions 307 are disposed between a photoelectric conversion portion, transistors, and the well contact part (activation region) 221 so as to electrically separate the elements from each other.

However, as described above, in order to provide the activation region 221 and the element separation regions 307 for achieving well contact for every pixel without changing the size of a pixel, the dimensions of an activation region used for a photoelectric conversion portion and transistors must be reduced. Thus, the characteristics, more specifically, the saturation level and the sensitivity of a pixel are reduced by a reduction in the dimensions of the activation region. In contrast, if the activation region 221 and the element separation regions 307 are provided without changing the dimensions of an activation region, the size of a pixel is increased due to the dimensions of the activation region.

Although a solid-state imaging device having an arrangement in which the P-well 302 is disposed in the N-substrate 301 and each element is disposed in the P-well 302 has been described above, a similar problem occurs in a solid-state imaging device having an impurity having an opposite conductivity type.

SUMMARY OF THE INVENTION

In order to solve the above problems, an object of the present invention is to provide a solid-state imaging device capable of minimizing an increase in the dimensions of a pixel and suppressing shading of an output signal due to a variation in the potential of a well.

According to an aspect of the present invention, a solid-state imaging device includes a pixel array area including pixels arranged in wells in a two-dimensional array fashion, each of the pixels including a photoelectric conversion portion including an activation region; a reading portion for reading a signal photo-electrically converted by the photoelectric conversion portion; and an amplifying portion for amplifying the signal read by the reading portion. The solid-state imaging device also includes well potential fixing parts each provided in the activation region of the photoelectric conversion portion in the corresponding pixel, the well potential fixing parts fixing the respective wells at a predetermined potential.

According to another aspect of the present invention, a solid-state imaging device includes a pixel array area including pixels arranged in wells in a two-dimensional array fashion, each of the pixels including a photoelectric conversion portion; a reading portion for reading a signal photo-electrically converted by the photoelectric conversion portion; and an amplifying portion for amplifying the signal read by the reading portion. The solid-state imaging device also includes well potential fixing parts each provided for a plurality of pixels in the pixel array area, the well potential fixing parts fixing the respective wells at a predetermined potential.

The term "fixing the respective wells at a predetermined potential" means not only that the respective wells are always kept at the predetermined potential but also that, when the potential of the respective wells varies, the potential is returned to and maintained at the predetermined potential.

BRIEF DESCRIPTION OF THE DRAWINGS

FIG. 10 illustrates interpolation of a signal of a pixel in which a well contact part is provided;

DESCRIPTION OF THE PREFERRED EMBODIMENTS

Embodiments of the present invention will be described with reference to the drawings.

Figure 1:
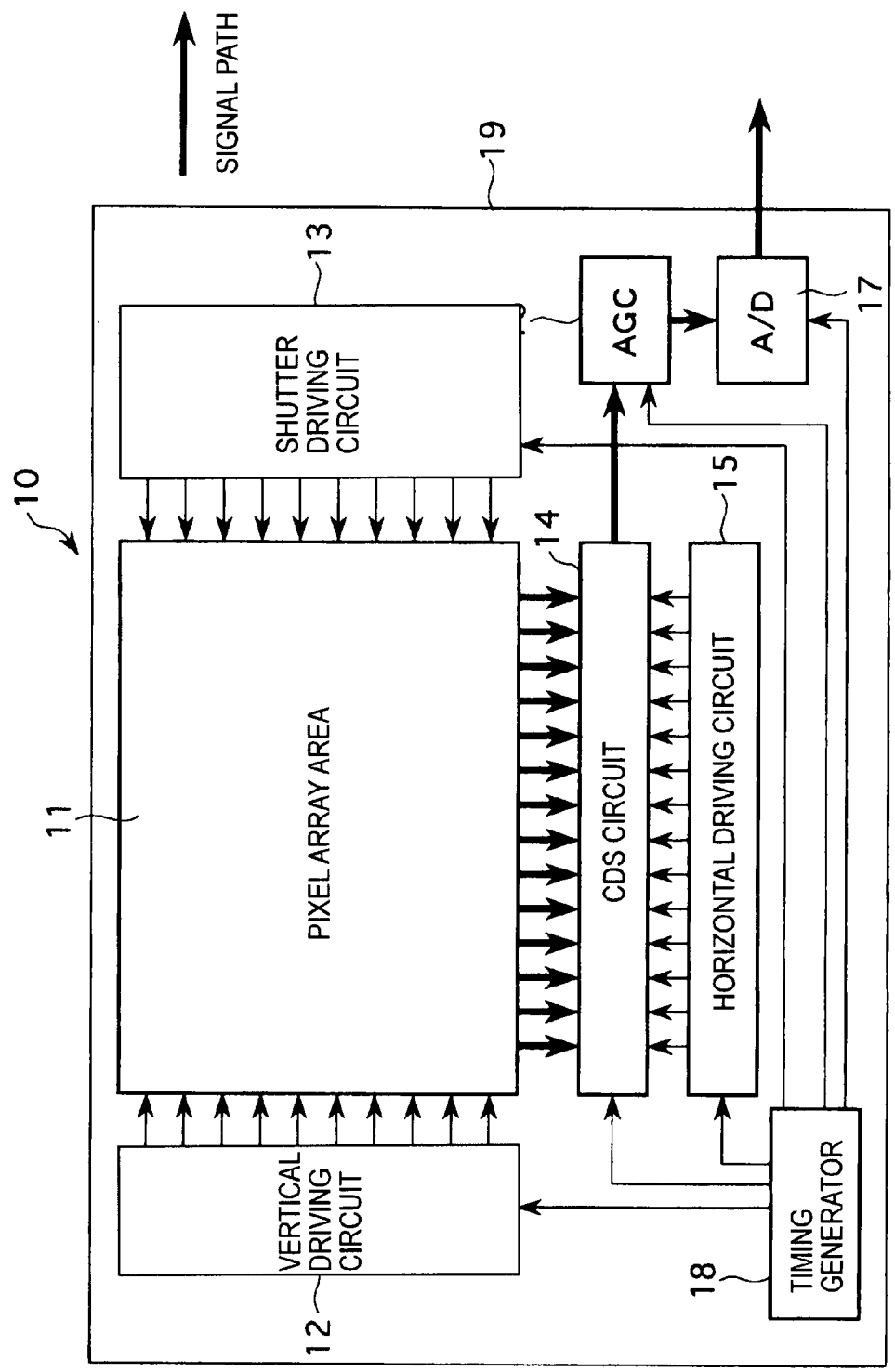
FIG. 1 is a block diagram schematically showing the arrangement of a CMOS image sensor according to the present invention.

FIG. 1 is a block diagram schematically showing the arrangement of a solid-state imaging device, such as a CMOS image sensor, according to the present invention. Referring to FIG. 1, a pixel array area 11, a vertical driving circuit 12, a shutter driving circuit 13, a correlated double sampling (CDS) circuit 14, a horizontal driving circuit 15, an automatic gain control (AGC) circuit 16, an analog/digital (A/D) conversion circuit 17, a timing generator 18, and the like are integrated on a substrate (chip) 19. Hereinafter, a semiconductor chip including the pixel array area 11 and the peripheral driving circuits 12 to 18 mounted on the chip 19 is referred to as a sensor chip 10.

The pixel array area 11 includes pixels arranged in a two-dimensional array fashion. Each of the pixels includes one or more photoelectric conversion portions. A pixel output line for outputting signals of the pixels and various control lines for driving the pixels are arranged so as to correspond to the arrangement of the pixels. Each of the pixels includes at least a photoelectric conversion portion for photo-electrically converting incident light to be accumulated, a reading portion for reading a signal charge from the photoelectric conversion portion to a floating doped region, a reset portion for resetting the floating doped region, and an amplifying portion for amplifying the signal charge read to the floating doped region. A specific example of a circuit of a pixel of this type will be described below.

The vertical driving circuit 12 supplies a scanning signal for selecting a row to be read from a pixel to the pixel array area 11. The shutter driving circuit 13 selects a row of a pixel, similarly to the vertical driving circuit 12. The shutter driving circuit 13 adjusts a driving interval with respect to the vertical driving circuit 12, so that an exposure time (accumulation time) for the photoelectric conversion portion can be adjusted. The CDS circuit 14 is disposed for one or more pixel columns of the pixel array area 11, and CDS-processes signals read from the rows selected by the vertical driving circuit 12. More specifically, the CDS circuit 14 receives the reset level and the signal level from each pixel and takes a difference between the reset level and the signal level, so that a fixed pattern noise for each pixel can be eliminated.

The horizontal driving circuit 15 sequentially selects a stored signal for each column after CDS-processed by the CDS circuit 14. The AGC circuit 16 amplifies the signal in the column selected by the horizontal driving circuit 15 with a proper gain. The A/D conversion circuit 17 converts an analog signal amplified by the AGC circuit 16 into a digital signal and outputs the digital signal outside the chip 19. The timing generator 18 generates various timing signals and drives the vertical driving circuit 12, the shutter driving circuit 13, the CDS circuit 14, the horizontal driving circuit 15, the AGC circuit 16, and the A/D conversion circuit 17.

The arrangement described above is merely an example of a CMOS image sensor. The present invention is not limited to this. In other words, the A/D conversion circuit 17 may not be arranged in the sensor chip 10. The A/D conversion circuit 17 may be arranged for each pixel column. Only one CDS circuit 14 may be provided. A plurality of output systems including the CDS circuit 14, the AGC circuit 16, and the like may be provided.

Figure 2:
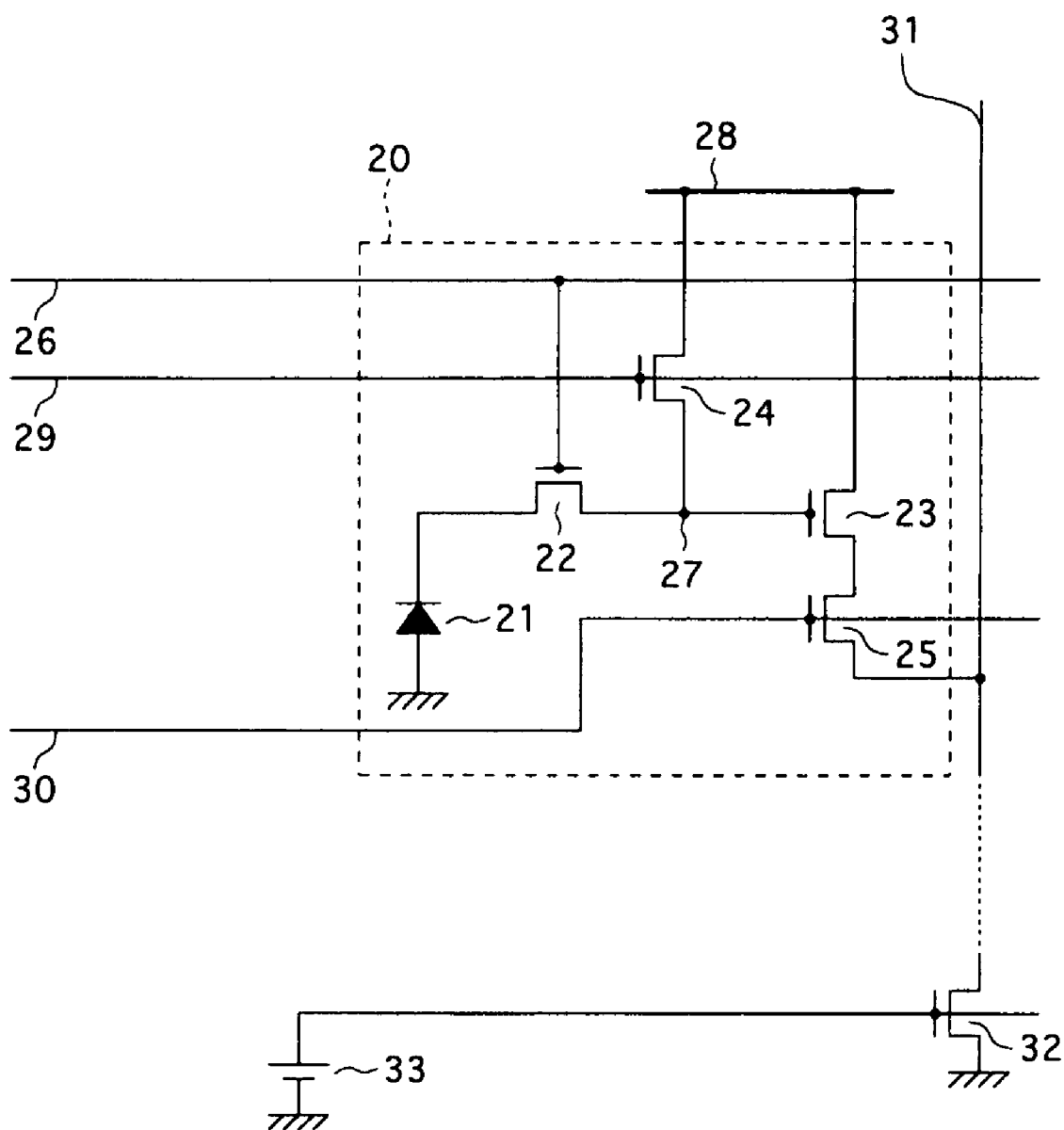
FIG. 2 is a circuit diagram showing an example of the arrangement of a unit pixel.

FIG. 2 is a circuit diagram showing an example of the arrangement of a unit pixel 20. As shown in FIG. 2, the unit pixel 20 according to this example includes a photoelectric conversion portion 21 and four transistors: a transfer transistor 22, an amplifying transistor 23, a reset transistor 24, and a selection transistor 25. The transfer transistor 22, the amplifying transistor 23, the reset transistor 24, and the selection transistor 25 are, for example, N-MOS transistors. However, the transfer transistor 22, the amplifying transistor 23, the reset transistor 24, and the selection transistor 25 may be P-MOS transistors, instead of N-MOS transistors.

The anode of the photoelectric conversion portion 21 is grounded. The photoelectric conversion portion 21 photo-electrically converts incident light into an electric charge of an electron (or a positive hole) corresponding to the amount of the incident light to be accumulated. The source of the transfer transistor 22 is connected to the cathode of the photoelectric conversion portion 21, and the gate of the transfer transistor 22 is connected to a transfer signal wire 26. Also, the drain of the transfer transistor 22 is connected to a gate input 27 of the amplifying transistor 23. When the potential of the transfer signal wire 26 becomes the potential of a power supply wire 28 (hereinafter, referred to as an "H" level), the transfer transistor 22 transfers the electric charge accumulated in the photoelectric conversion portion 21 to the gate input 27 of the amplifying transistor 23.

The gate of the amplifying transistor 23 is connected to the gate input 27, and the drain of the amplifying transistor 23 is connected to the power supply wire 28. Also, the source of the amplifying transistor 23 is connected to the drain of the selection transistor 25. The amplifying transistor 23 outputs a voltage corresponding to the electric charge that is transferred by the transfer transistor 22 from the photoelectric conversion portion 21 to the gate input 27 to the source side. The source of the reset transistor 24 is connected to the gate input 27 of the amplifying transistor 23, and the drain of the reset transistor 24 is connected to the power supply wire 28. Also, the gate of the reset transistor 24 is connected to a reset signal wire 29. When the potential of the reset signal wire 29 becomes the "H" level, the potential of the gate input 27 is reset to the potential of the power supply wire 28, which is a power supply voltage.

The drain of the selection transistor 25 is connected to the source of the amplifying transistor 23, and the gate of the selection transistor 25 is connected to a selection signal wire 30. Also, the source of the selection transistor 25 is connected to a pixel output line 31. When the potential of the selection signal wire 30 becomes the "H" level, the selection transistor 25 is turned on and allows conduction between the source of the amplifying transistor 23 and the pixel output line 31. Pixels for respective rows are connected to the pixel output line 31 in parallel. One end of the pixel output line 31 is connected to the CDS circuit 14. The other end of the pixel output line 31 is connected to a transistor 32. The gate of the transistor 32 is biased at a constant voltage by a bias power supply 33, and the transistor 32 operates as a constant current source.

In the unit pixel 20 having the arrangement described above, when the selection transistor 25 of a pixel is turned on, the amplifying transistor 23 and the constant-current transistor 32 function as a source follower. Thus, a voltage that has a predetermined potential difference from the potential of the gate input 27 of the amplifying transistor 23 is output to the pixel output line 31.

First Embodiment

According to a first embodiment of the present invention, in a solid-state imaging device, such as a CMOS image sensor having the arrangement shown in FIG. 1, by achieving well contact in an activation region of a photoelectric conversion portion for each pixel in the pixel array area 11, an increase in the dimensions of a unit pixel (the size of a pixel) is minimized and shading of an output signal due to a variation in the potential of a well is suppressed.

Figure 3:
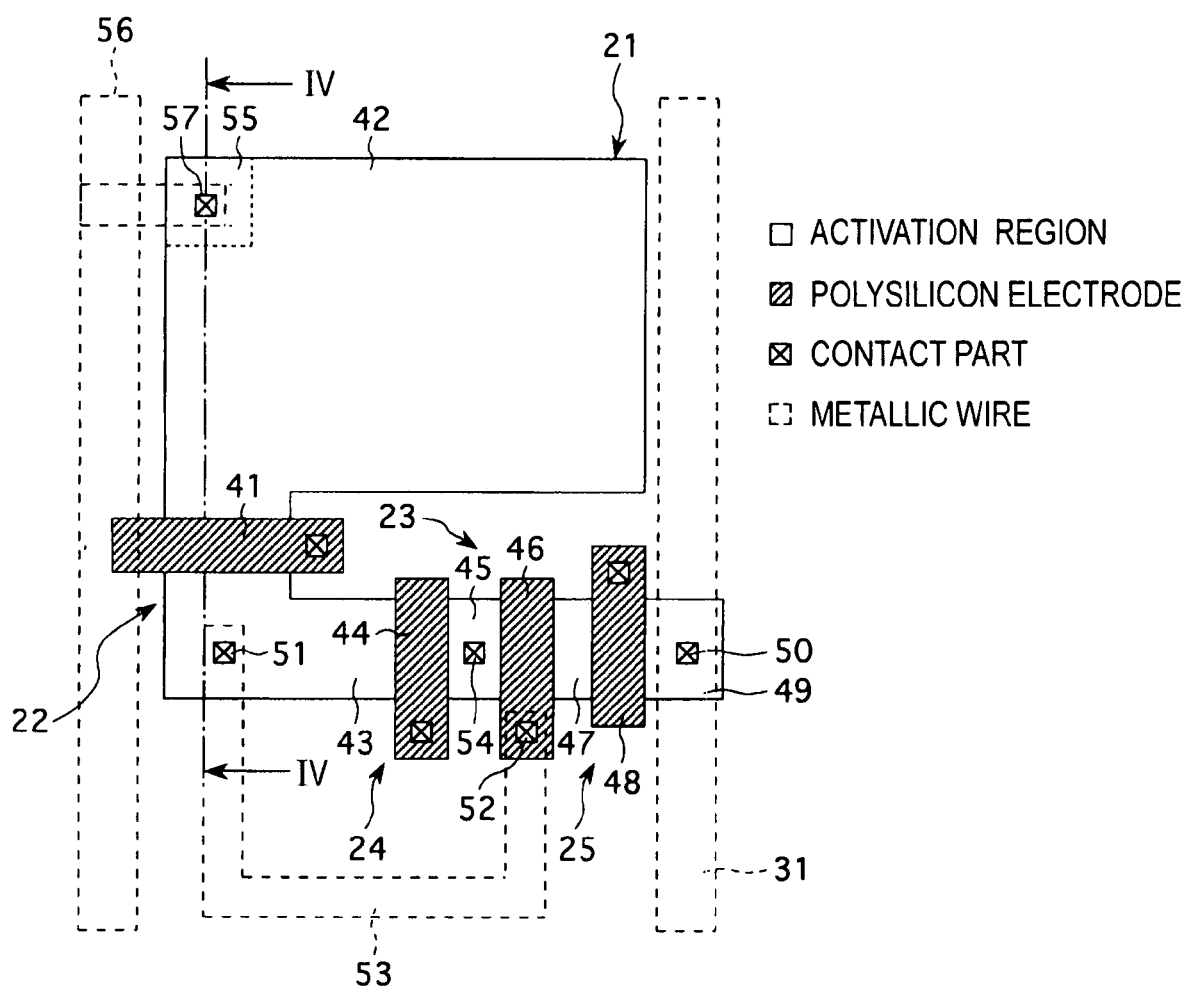
FIG. 3 is a plan pattern view showing a pixel structure according to a first embodiment.

FIG. 3 is a plan pattern view showing a pixel structure according to the first embodiment. In FIG. 3, parts equivalent to those in FIG. 2 are represented by the same reference numerals.

Referring to FIG. 3, a gate electrode 41 is disposed between a photoelectric conversion region (activation region) 42 and an activation region 43 of the photoelectric conversion portion 21, and constitutes the transfer transistor 22. The activation region 43 is a drain region of the transfer transistor 22, a source region of the reset transistor 24, and the gate input 27 of the amplifying transistor 23. A gate electrode 44 is disposed between the activation region 43 and an activation region 45, and constitutes the reset transistor 24. The activation region 45 is a drain region of the reset transistor 24 and a drain region of the amplifying transistor 23.

A gate electrode 46 is disposed between the activation region 45 and an activation region 47, and constitutes the amplifying transistor 23. The activation region 47 is a source region of the amplifying transistor 43 and a drain region of the selection transistor 25. A gate electrode 48 is disposed between the activation region 47 and an activation region 49, and constitutes the selection transistor 25. The activation region 49 is a source region of the selection transistor 25, and is electrically connected to the pixel output line 31, which is a metallic wire, at a contact part 50.

The gate electrodes 41, 44, 46, and 48 are, for example, polysilicon electrodes. The activation region 43 and the gate electrode 46 are electrically connected to each other via a metallic wire 53 at contact parts 51 and 52. The activation region 45 is connected to a power supply via a metallic line (not shown) at a contact part 54. Although wires extending in the row direction (the lateral direction in the drawing), that is, the transfer signal wire 26, the reset signal wire 29, and the selection signal wire 30 are not illustrated in FIG. 3, the gate electrodes 41, 44, and 48 are electrically connected to the transfer signal wire 26, the reset signal wire 29, and the selection signal wire 30, respectively.

With the pixel structure described above, according to the first embodiment, a rectangular corner portion of the activation region 42, which is a photoelectric conversion region, of the photoelectric conversion portion 21 is evenly cut off, and the cut-off area is used as a well contact part 55. In other words, the activation region 42, which is a photoelectric conversion region, of the photoelectric conversion portion 21 and the well contact part 55 are formed in the same activation region 42. The well contact part 55 is electrically connected to a metallic wire 56 that supplies a predetermined potential, such as a ground potential, and that extends in the vertical direction (the longitudinal direction in the drawing) at a contact part 57 and functions as a potential fixing part.

Figure 4:
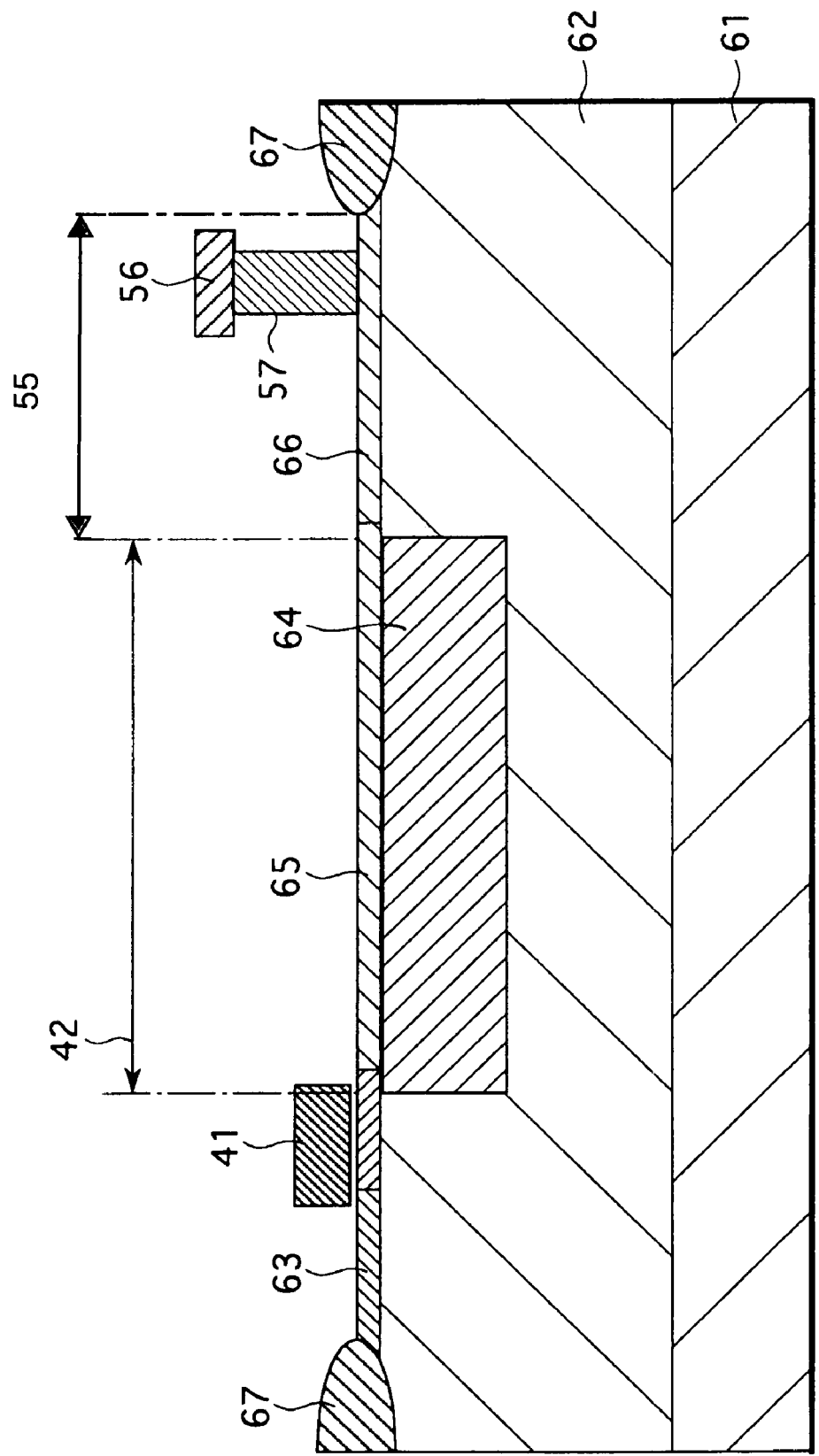
FIG. 4 is a sectional view taken along the line IV-IV of FIG. 3.

FIG. 4 is a sectional view taken along the line IV-IV of FIG. 3. In FIG. 4, parts equivalent to those in FIG. 3 are represented by the same reference numerals. In the example shown in FIG. 4, a P-well 62 is disposed in an N-substrate 61, and the photoelectric conversion portion 21 and the transistors 22 to 24 of the pixel are disposed in the P-well 62. An N-region 63 is an activation region (the activation region 43 in FIG. 3) connected to the gate electrode 46 of the amplifying transistor 23 via a metallic wire 53 at the contact part 51.

The activation region 42 includes an N-type impurity region 64, a P+ region 65 near the surface of the N-type impurity region 64, and a P-well 62 peripheral to the N-type impurity region 64. A P+ region 66 is connected to the metallic wire 56 via a doped layer and the contact part 57 in that order, and fixes the potential of the P-well 62 at the ground potential via the metallic wire 56. A P+ impurity of a density that is higher than the P+ region 65 near the surface of the activation region 42 is implanted into the P+ region 66. This prevents an influence of the well contact part 55 upon the activation region 42. Element separation regions 67, which are local oxidization on silicon (LOCOS), shallow trench isolation (STI), or the like, are disposed between the photoelectric conversion portion 21 and the transistors 22 to 24 so as to electrically separate the elements from each other.

As described above, in a solid-state imaging device having an arrangement in which well contact is achieved for each pixel, by forming the well contact part 55 in the activation region 42 of the photoelectric conversion portion 21 without providing an element separation region between the well contact part 55 and the activation region 42 of the photoelectric conversion portion 21, a part required for an element separation region in the known technology can be used for the activation region 42 of the photoelectric conversion portion 21. This arrangement reduces a burden on other elements due to provision of the well contact part 55.

More specifically, when the well contact part 55 is formed in the activation region 42 of the photoelectric conversion portion 21 in order to achieve well contact for every pixel without changing the size of the pixel, the dimensions to be cut off from the activation region 42 can be reduced compared with the known technology. Thus, a reduction in the characteristics, more specifically, reductions in the saturation level and the sensitivity of the pixel can be minimized. As a result of this, since the potential of the P-well 62 can be fixed electrically firmly, an increase in the dimensions of a unit pixel (the size of a pixel) can be minimized, and shading of an output signal due to a variation in the potential of a well can be suppressed.

Although a solid-state imaging device having an arrangement in which the P-well 62 is formed in the N-substrate 61 and each element is formed in the P-well 62 have been described in the first embodiment, a solid-state imaging device having an impurity whose conductivity type is opposite can achieve similar advantages.

Second Embodiment

According to a second embodiment of the present invention, in a solid-state imaging device, such as a CMOS image sensor having the arrangement shown in FIG. 1, by achieving well contact for a plurality of adjoining pixels, instead of for each pixel, a reduction in the characteristics, more specifically, reductions in the saturation level and the sensitivity of the pixel can be suppressed. Specific examples will be described below.

First Example

Figure 5:
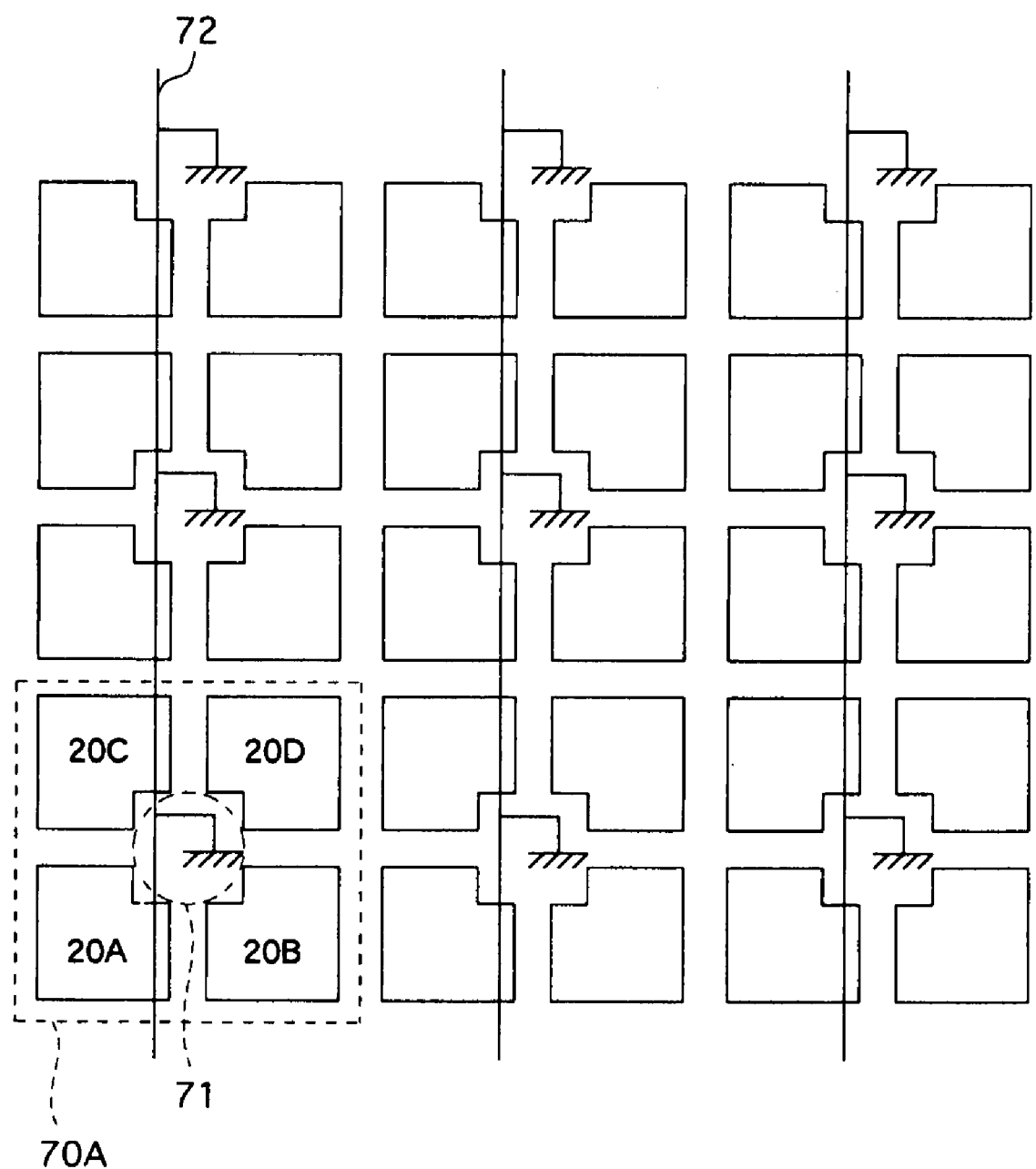
FIG. 5 is a plan view schematically showing the arrangement of a pixel array area according to a first example of a second embodiment of the present invention.

FIG. 5 is a plan view schematically showing the arrangement of a pixel array area 11A according to a first example of the second embodiment. Here, in order to simplify the drawing, the pixel array area 11A has a pixel arrangement of five rows and six columns.

As shown in FIG. 5, in the pixel array area 11A according to the first example, a plurality of adjoining pixels, for examples, four pixels, pixels 20A to 20D, constitute a unit cell 70A. A well contact part 71 is provided in the unit cell 70A for the pixels 20A to 20D without changing the size of each pixel. More specifically, rectangular corners, which are adjacent to each other, of the pixels 20A to 20D are evenly cut off, and the well contact part 71 is formed at the intermediate portion of the pixels 20A to 20D. Also, well potential fixing wires 72 each supplying a well potential to the well contact part 71 are arranged in every two columns (or every two rows), and are each electrically connected to the well contact part 71.

As the well contact part 71, an activation region for achieving well contact for each pixel may be provided separately from an activation region of a photoelectric conversion portion and an element separation region may be provided to separate such activation regions, as in the known technology. Alternatively, an activation region for achieving well contact for each pixel may be provided in an activation region of a photoelectric conversion portion, as in the first embodiment.

As described above, by providing the well contact part 71 in the unit cell 70A constituted by a plurality of adjoining pixels without changing the pixel size, the well potential can be fixed further firmly and evenly compared with a known technology in which well contact is achieved only around the periphery of the pixel array area 11A. Also, since the well contact part 71 is formed by cutting off parts of the plurality of pixels (four pixels in this example), the dimensions of a part of each pixel cut off due to the provision of the well contact part 71 are reduced compared with a case where a well contact part is provided for each pixel. Thus, a reduction in the characteristics, more specifically, reductions in the saturation level and the sensitivity of the pixel can be minimized.

However, since four different patterns of pixel shapes, which are due to differences in the positions of parts that are cut off in order to provide the well contact part 71, among the pixels 20A to 20D and the existence of the well potential fixing wires 72 make the optical characteristics different depending on the column (or the row) through which the well potential fixing wire 72 passes. As a result of this, the existence of pixels of four different types of characteristics in the pixel array area 11A needs correction that is different depending on the shape of a pixel for each row and column by a signal processing system downstream.

Figure 6:
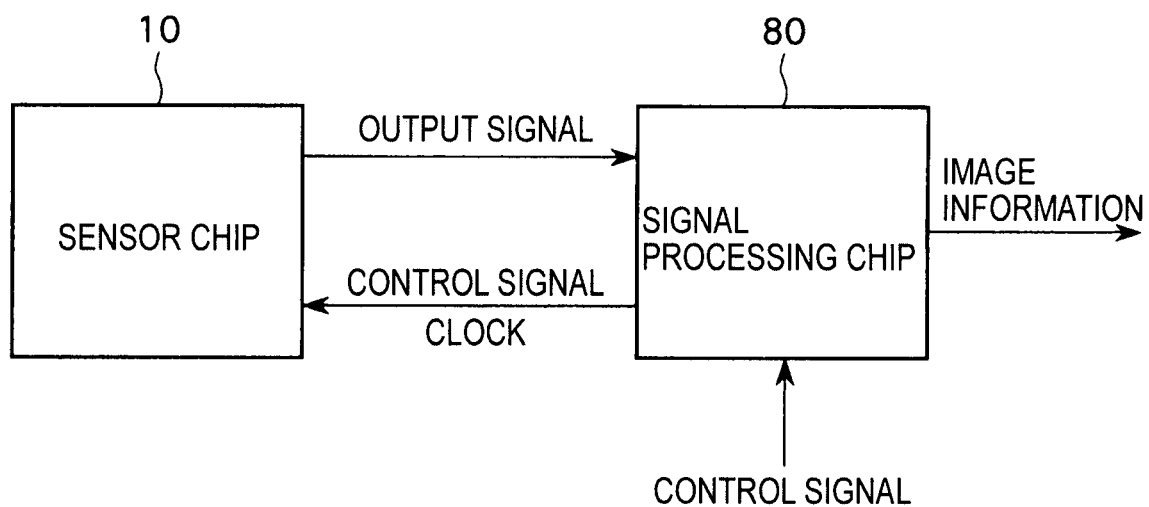
FIG. 6 is a block diagram showing the relationship between a sensor chip and a signal processing chip.

The signal processing system for performing the correction will be described. As shown in FIG. 6, a signal processing chip 80 for performing the correction is provided for the sensor chip 10 (see FIG. 1) on which the pixel array area 11A and peripheral driving circuits are mounted. The signal processing chip 80 supplies clocks and control signals to the sensor chip 10 and drives each pixel in the pixel array area 11A. The signal processing chip 80 also creates picture data, as described below, by using signals output from the sensor chip 10.

Only signals of levels corresponding to electron numbers that are photo-electrically converted at respective pixels are output from the sensor chip 10 at predetermined intervals. The signal processing chip 80 performs coding with respect to the arrangement of the output signals using red (R), green (G), and blue (B), and makes sensitivities that are different depending on the color equal to each other by applying a gain in order to create picture data. Also, with respect to a pixel exhibiting an abnormal output value in the sensor chip 10, the signal processing chip 80 records an address of a particular pixel in advance in a memory (not shown) contained in the signal processing chip 80, reads and abandons a signal output from the particular pixel, and averages and weights peripheral pixel signals filtered by the same color, so that an output signal of the pixel is created and output. With respect to a vertical line and a horizontal line, the signal processing chip 80 also performs correction by applying a gain to a signal of a row and column, the gain being different from that for the other rows and columns. Accordingly, in addition to creation of a picture, correction and interpolation can be achieved.

In the pixel array area 11A according to the first example, although the pixels 20A to 20D are arranged at a predetermined interval, the shapes of the pixels are different from each other. Thus, when signals are output, a difference in the pixel characteristics, such as a difference in the saturation level and a difference in the sensitivity, may appear in a picture. Also, a difference in the sensitivity is caused depending on the existence or absence of the well potential fixing wire 72 (see FIG. 5). Since the difference in the saturation level and the difference in the sensitivity are fixed based on the shape of a pixel, the differences can be eliminated by knowing the amount of correction for the differences in advance and by adjusting a gain to be applied to each pixel signal by the signal processing chip 80 downstream in accordance with the amount of correction.

Figure 7:
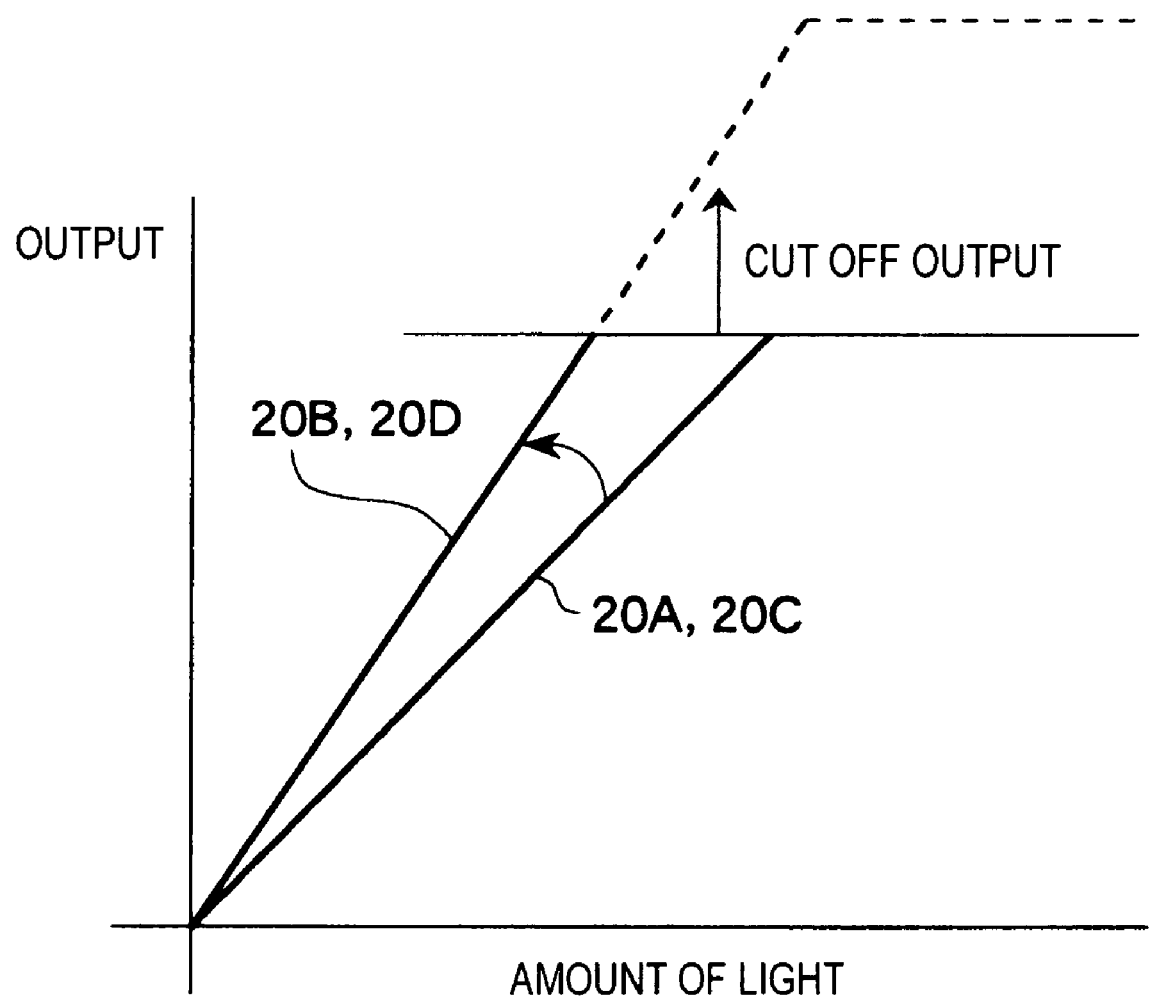
FIG. 7 illustrates an output level with respect to the amount of light of each pixel in a unit cell.

FIG. 7 illustrates an output level with respect to the amount of light of each of the pixels 20A to 20D in the unit cell 70A. The sensitivities of the pixels 20A and 20C are lower than those of the pixels 20B and 20D due to the existence of the well potential fixing wire 72. Also, since the dimensions of the pixels 20A to 20D are equal to each other, the saturation levels of the pixels 20A to 20D are equal to each other. The difference in the sensitivities between the pixels 20A and 20C and the pixels 20B and 20D appears as the difference in the level between columns when a picture is viewed. In order to eliminate the difference in sensitivities, the signal processing chip 80 applies a gain to signals of the pixels 20A and 20C, and performs clip at a saturation level of the pixels 20B and 20D (a broken line in FIG. 7). Accordingly, the sensitivities can be set to the same value, and the saturation levels can be set to the same value.

Second Example

Figure 8:
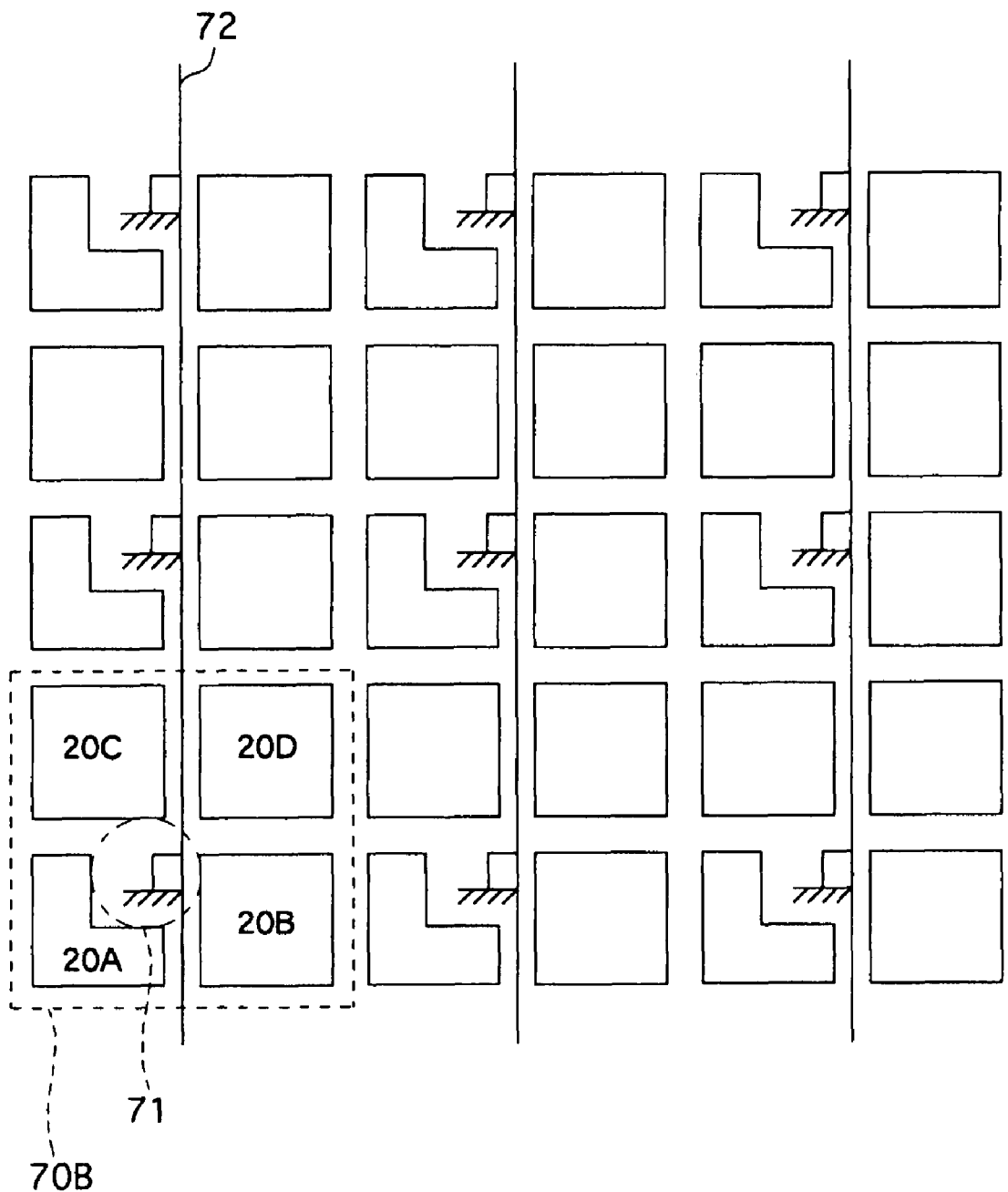
FIG. 8 is a plan view schematically showing the arrangement of a pixel array area according to a second example of the second embodiment.

FIG. 8 is a plan view schematically showing the arrangement of a pixel array area 11B according to a second example of the second embodiment. In FIG. 8, parts equivalent to those in FIG. 5 are represented by the same reference numerals. Here, in order to simplify the drawing, the pixel array area 11B also has a pixel arrangement of five rows and six columns.

In the pixel array area 11B according to the second example, four pixels, the pixels 20A to 20D, constitute a unit cell 70B and the well contact part 71 is provided for the pixels 20A to 20D, as in the pixel array area 11A according to the first example. Thus, an advantage similar to the first example can be achieved. In addition, in the pixel array area 11B according to the second example, in order to ensure the space for the well contact part 71, the ratio of dimensions of cut-off parts of the plurality of pixels is changed. Thus, a disadvantage of the first example in which a plurality of pixel patterns are generated by an arrangement in which parts having equal dimensions are cut off from a plurality of pixels in order to ensure the space for the well contact part 71 can be overcome.

In the pixel array area 11B according to the second example, the dimensions of the well contact part 71 are associated only with the pixel 20A. Thus, the left pixels 20B to 20D have a structure similar to a known pixel not provided with a well contact part. Also, the pixel 20A has a sensitivity and a saturation level lower than the pixels 20B to 20D having a different shape from the pixel 20A since the pixel 20A is involved in the provision of the well contact part 71.

Although, in the pixel array area 11B according to the second example, the well potential fixing wires 72 are arranged between pixel columns (or may be arranged between pixel rows), if the well potential fixing wires 72 are arranged on pixels, as in the first example, differences in the sensitivity and the saturation level occur between a pixel through which the well potential fixing wire 72 passes and a pixel through which the well potential fixing wire 72 does not pass. The sensitivities can be set to the same value and the saturation levels can be set to the same value by the signal processing chip 80 downstream (see FIG. 6), as in the first example.

Third Example

Figure 9:
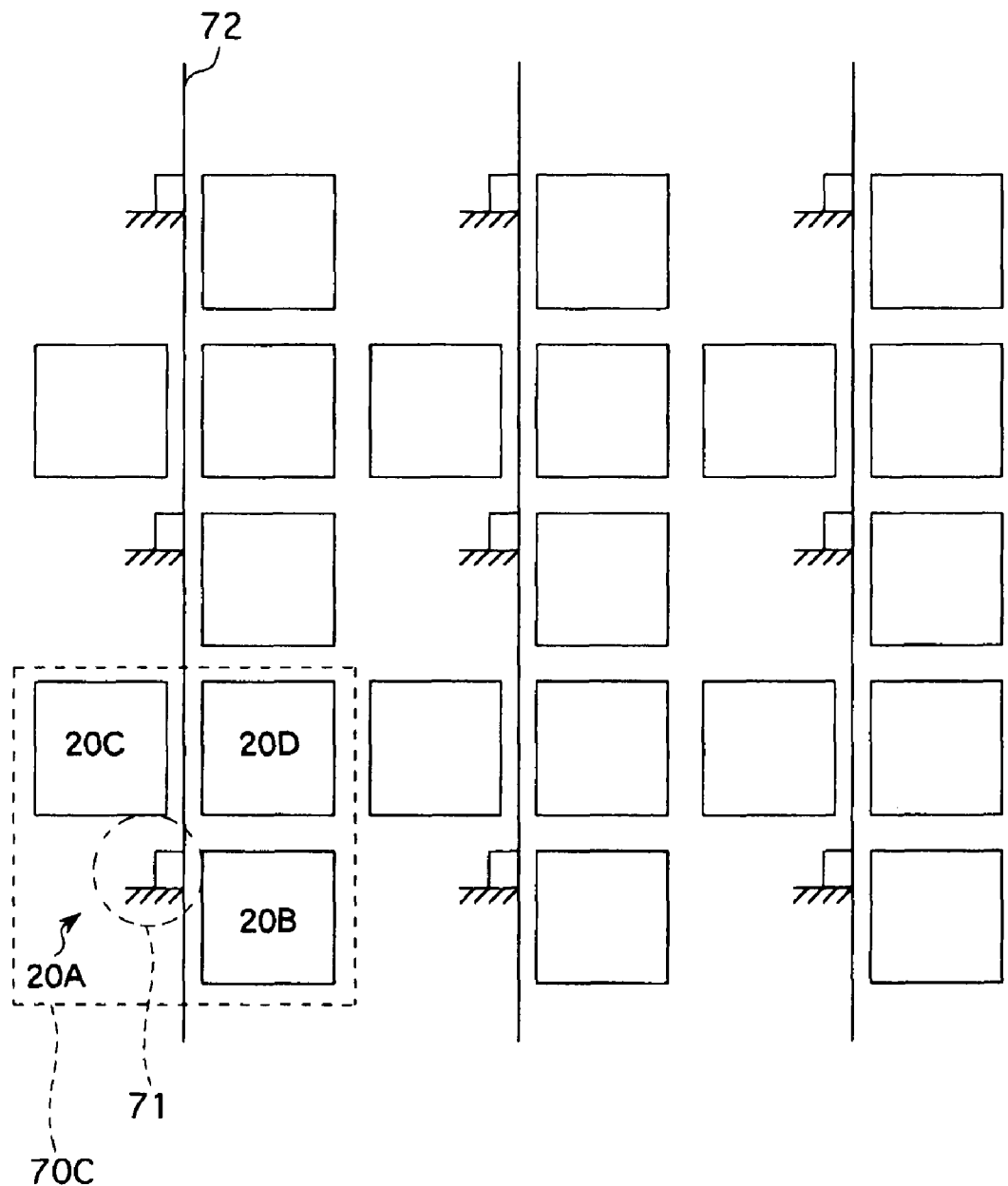
FIG. 9 is a plan view schematically showing the arrangement of a pixel array area according to a third example of the second embodiment.

FIG. 9 is a plan view schematically showing the arrangement of a pixel array area 11C according to a third example of the second embodiment. In FIG. 9, parts equivalent to those in FIG. 5 are represented by the same reference numerals. Here, in order to simplify the drawing, the pixel array area 11C also has a pixel arrangement of five rows and six columns.

In the pixel array area 11C according to the third example, four pixels, the pixels 20A to 20D, constitute a unit cell 70C, as in the first and second examples. Also, in a portion, for example, to which the pixel 20A belongs of the unit cell 70C, the well contact part 71 is provided, without providing a pixel itself. A signal for the pixel corresponding to the portion to which the pixel 20A belongs is generated by averaging signals from pixels peripheral to the portion to which the pixel 20A belongs by the signal processing chip 80 downstream (see FIG. 6). The pixels 20B to 20D, which are other than the portion to which the well contact part 71 belongs, each has dimensions equal to a known pixel not provided with a well contact part.

Although, in the pixel array area 11C according to the third example, the well potential fixing wires 72 are also arranged between pixel columns (or may be arranged between pixel rows), if the well potential fixing wires 72 are arranged on pixels, as in the first example, differences in the sensitivity and the saturation level occur between a pixel through which the well potential fixing wire 72 passes and a pixel through which the well potential fixing wire 72 does not pass. The sensitivities can be set to the same value and the saturation levels can be set to the same value by the signal processing chip 80 downstream (see FIG. 6), as in the first example.

FIG. 10 illustrates interpolation of a signal of a pixel in which the well contact part 71 is provided. In FIG. 10, normal pixels are represented using a background of white, and pixels in which the well contact parts 71 are provided are represented using a background of oblique lines. Information on a pixel having the background of oblique lines is obtained by calculating the average of information on, for example, eight pixels peripheral to the pixel. For example, in FIG. 10, pixel information B1 is obtained by calculating the average of information on the eight peripheral pixels A1 to A8, in other words, (A1+A2+ . . . A8)/8.

Although information on a pixel in which the well contact part 71 is provided is interpolated by using information on the eight peripheral pixels in the third example, the present invention is not limited to this. Information on a pixel in which the well contact part 71 is provided may be interpolated by using at least information on pixels in the same row or the same column as the pixel in which the well contact part 71 is provided or at least information on pixels in the same row and the same column as the pixel in which the well contact part 71 is provided.

Although, in the first to third examples described above, the well contact part 71 is provided for the four pixels, the pixels 20A to 20D, and parts of a plurality of pixels or a part of a pixel is cut off in order to ensure the space for the well contact part 71, the present invention is not limited to this. The ratio of the existence of the well contact part 71 or the ratio of pixels involved in the provision of the well contact part 71 may be changed. Also, the dimensions of a well for which the well contact part 71 is provided, a pixel in which the provision of the well contact part 71 is involved, and the like are determined in accordance with the burden of correction for a difference in the pixel shape by the signal processing chip 80 downstream, the amount of reduction of the characteristics per pixel, and the like.

Although, in the first to third examples described above, correction of a signal of a pixel in which the well contact part 71 is provided is performed, by the signal processing chip 80, outside the sensor chip 10, the present invention is not limited to this. A function of the signal processing chip 80 may be installed in the downstream of the A/D conversion circuit 17 of the sensor chip 10, so that correction can be performed inside the sensor chip 10.

Figure 11:
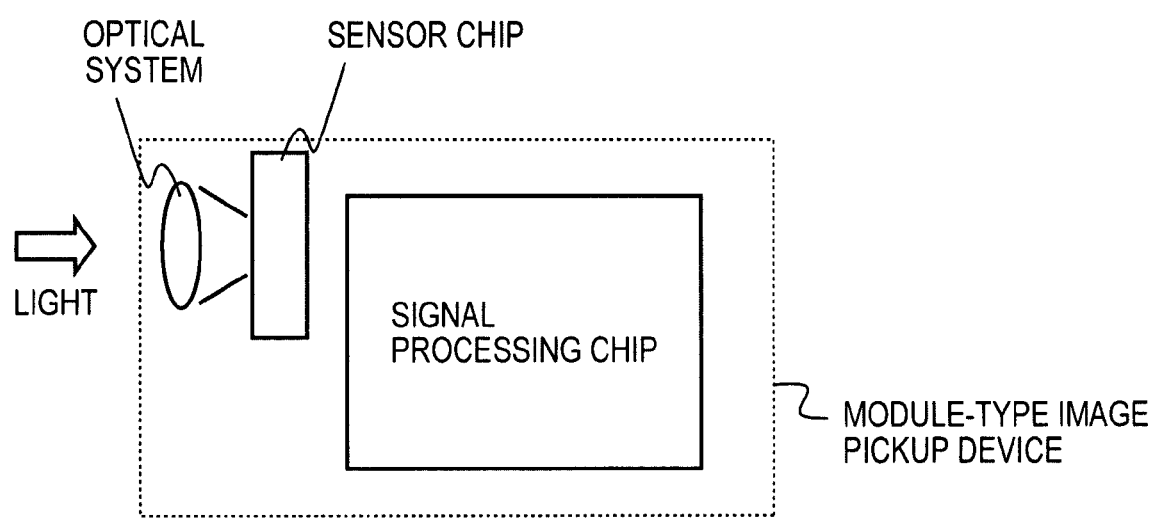
FIG. 11 illustrates a module-type solid-state imaging device.
Figure 12:
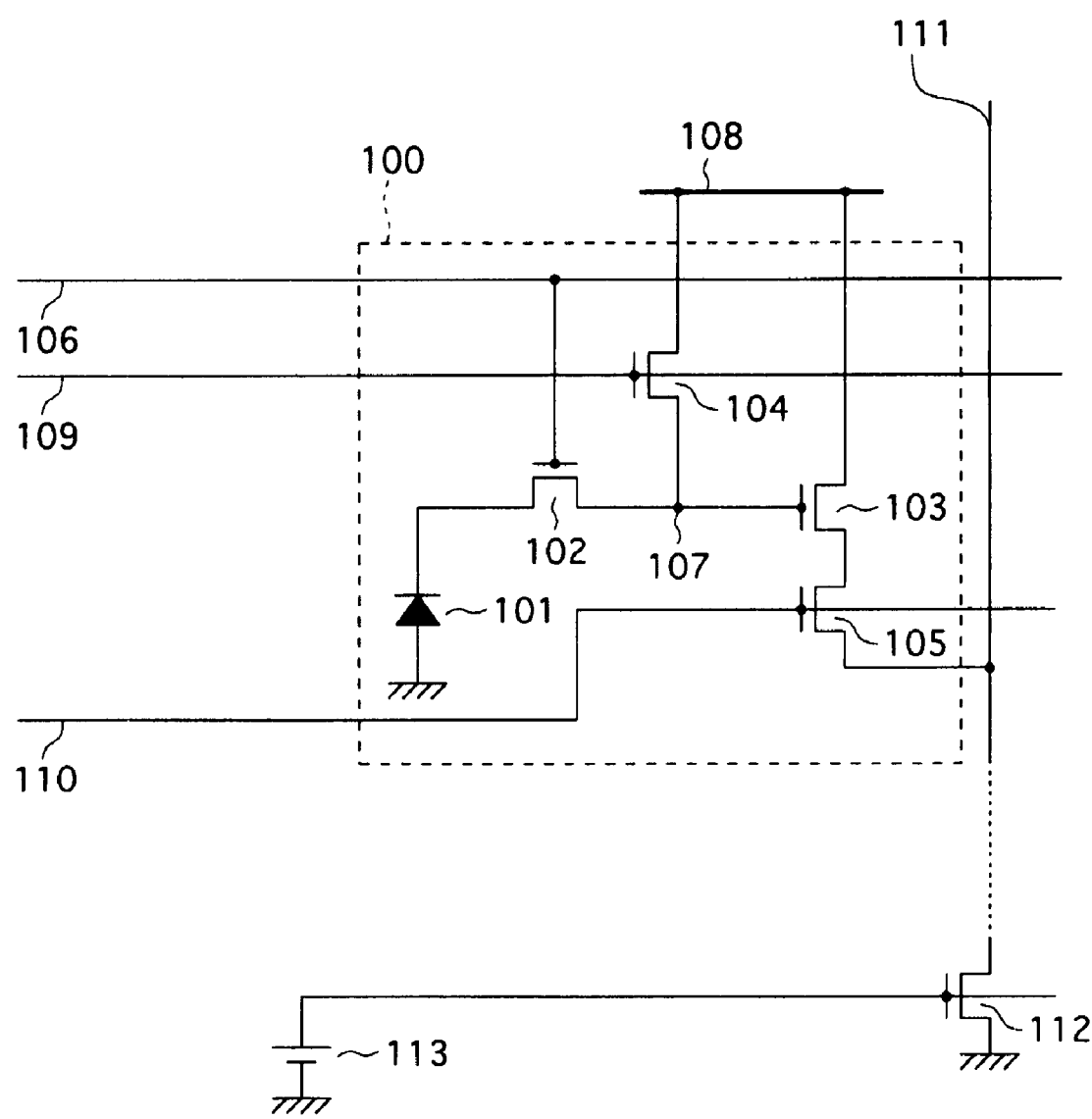
FIG. 12 is a circuit diagram showing a known arrangement of a unit pixel.
Figure 13:
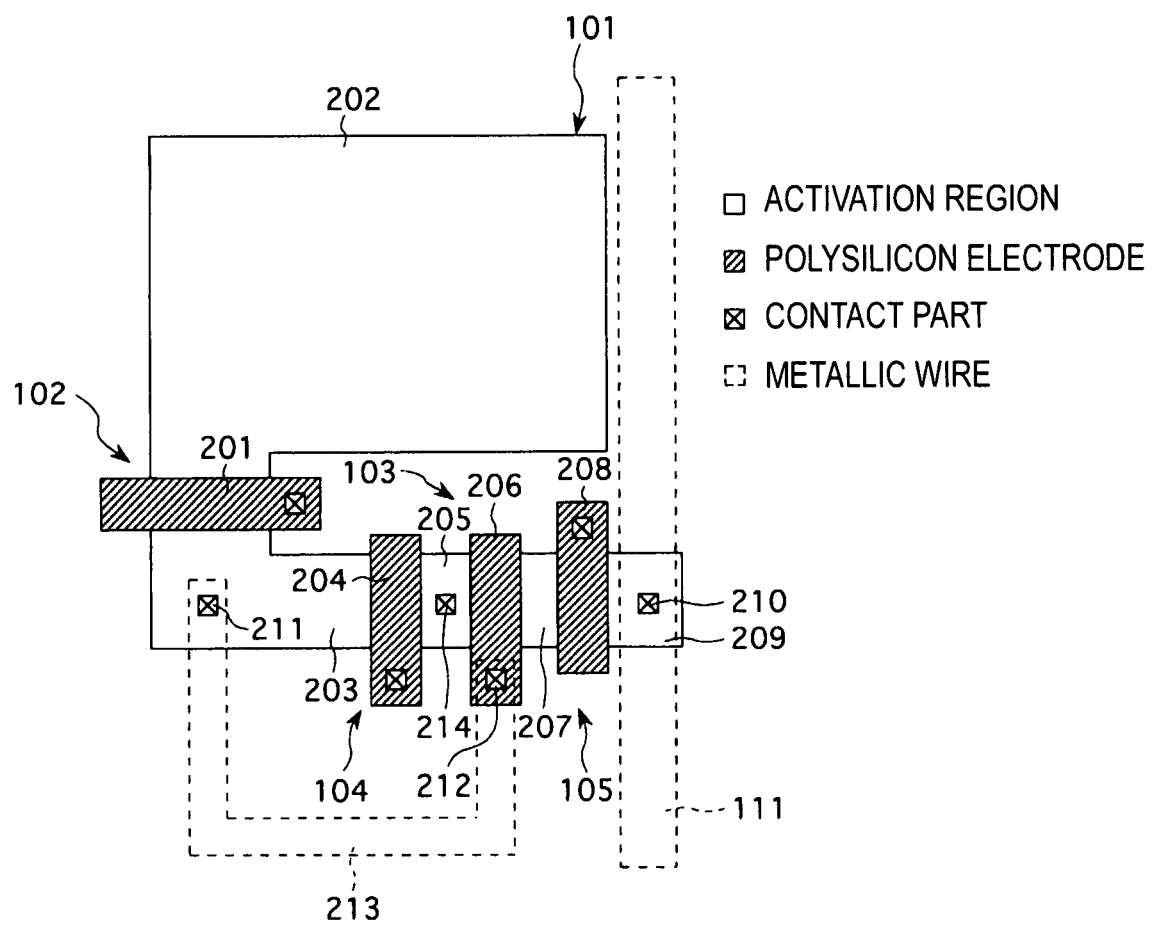
FIG. 13 is a plan pattern view showing a known structure of the unit pixel.
Figure 14:
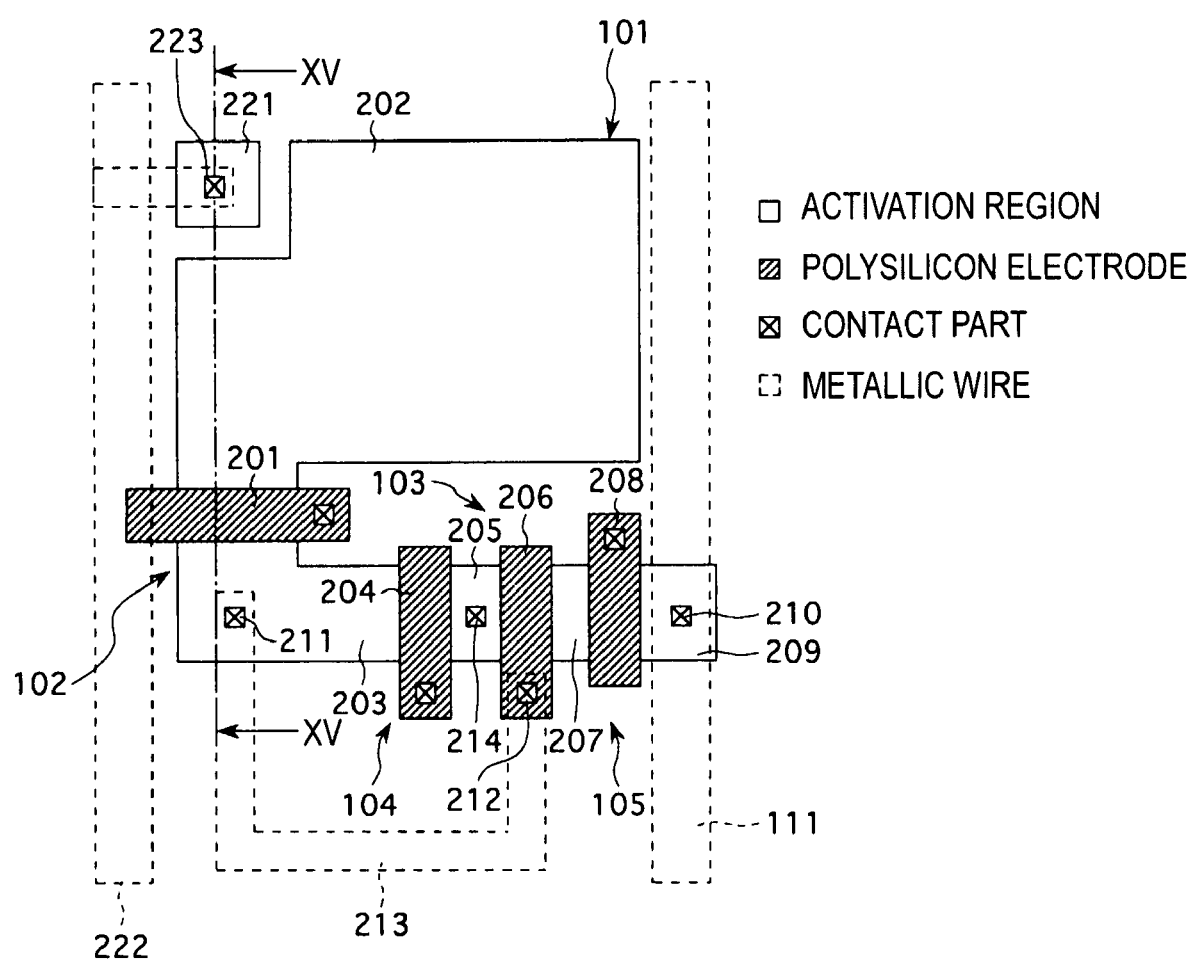
FIG. 14 is a plan pattern view showing a known pixel structure providing a well contact part for each pixel.
Figure 15:
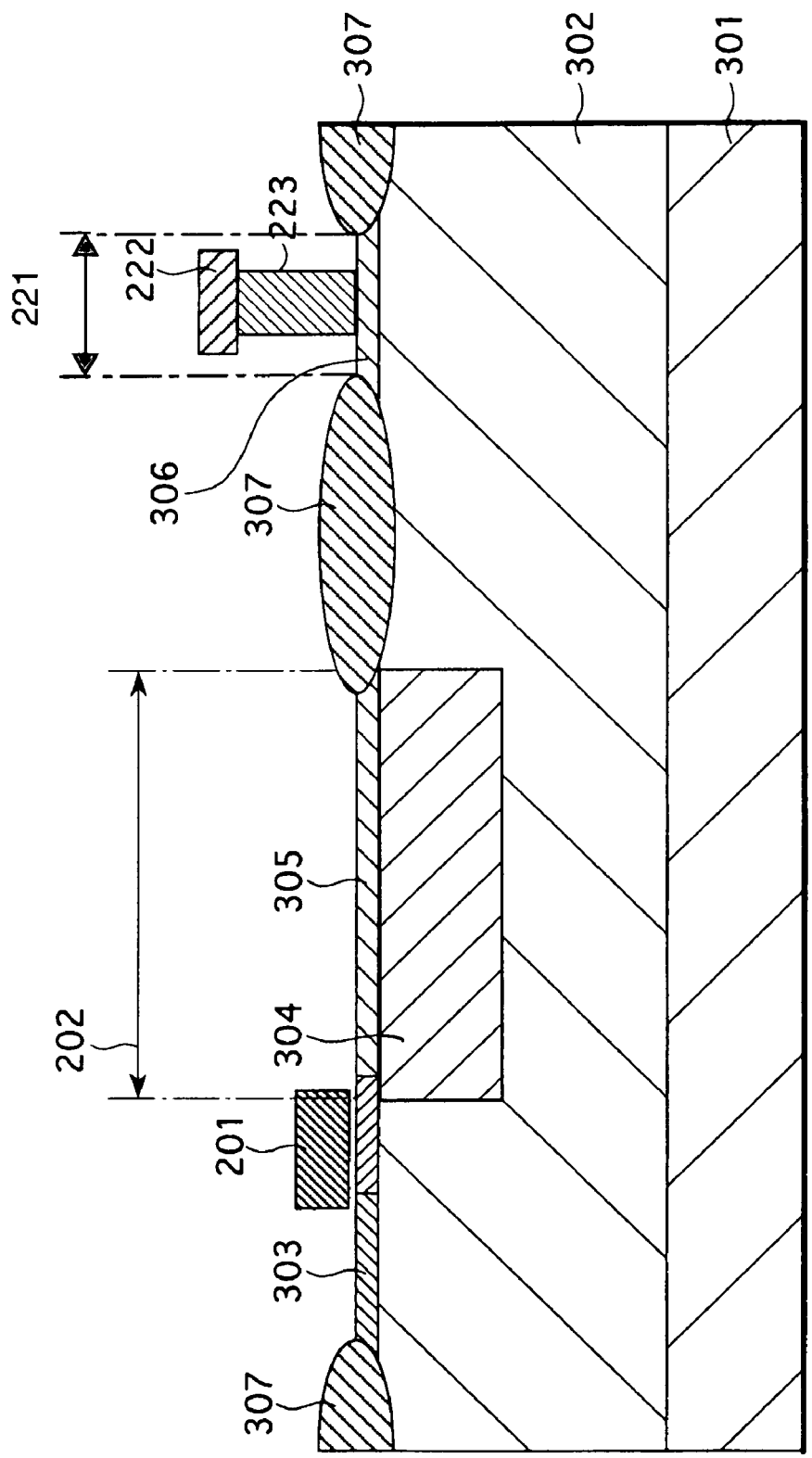
FIG. 15 is a sectional view taken along the line XV-XV of FIG. 14.

Although cases where a solid-state imaging device according to the present invention is formed as a chip have been explained, the present invention is also applicable to a module-type imaging device or camera. FIG. 11 illustrates a module-type solid-state imaging device formed as an aggregation of a plurality of chips. The solid-state imaging device includes a sensor chip for capturing images, a signal processing chip for performing digital signal processing, and the like. Furthermore, the solid-state imaging device may include an optical system. In this case, the characteristics of a video signal from such a module-type imaging device are improved.

The solid-state imaging device according to each of the first and second embodiments of the present invention can be used as an imaging device for a camera module, such as a digital still camera or a video camera. The solid-state imaging device can also be used as an imaging device for a portable terminal, typified by a cellular telephone set having a camera function.

What is claimed is:

1. A solid-state imaging device comprising:
    a pixel array area including pixels arranged in a well region in a two-dimensional array fashion, each of the pixels including: a photoelectric conversion portion including an activation region; a reading portion for reading a signal photo-electrically converted by the photoelectric conversion portion; and an amplifying portion for amplifying the signal read by the reading portion; and
    well potential fixing parts each provided adjacent a corresponding activation region of the photoelectric conversion portion for the corresponding pixel, the well potential fixing parts fixing the respective wells at a predetermined potential, and wherein the well potential fixing part is immediately adjacent its corresponding activation region; and further wherein the photoelectric conversion portion includes a first impurity region of a first conductivity type and a second impurity region of a second conductivity type provided above the first impurity region; and each of the well potential fixing parts includes an impurity region of the second conductivity type whose density is higher than the second impurity region.

2. The solid-state imaging device according to claim 1, wherein the wells in the pixel array area are formed integrally and are fixed by the well potential fixing parts at each pixel.

3. A solid-state imaging device comprising a pixel array area including a plurality of pixels each including a photoelectric conversion portion, wherein the pixel array area includes a well portion and a potential fixing part for fixing the well portion at a predetermined potential, and wherein the well potential fixing part is immediately adjacent a corresponding activation region; and further wherein the photoelectric conversion portion includes a first impurity region of a first conductivity type and a second impurity region of a second conductivity type provided above the first impurity region; and each of the well potential fixing parts includes an impurity region of the second conductivity type whose density is higher than the second impurity region.

4. A module-type imaging device comprising a pixel array area including a plurality of pixels each including a photoelectric conversion portion, wherein the pixel array area includes a well portion; a potential fixing part for fixing the well portion at a predetermined potential; and an optical system for guiding incident light to the pixel array area, and wherein the well potential fixing part is immediately adjacent a corresponding activation region; and further wherein the photoelectric conversion portion includes a first impurity region of a first conductivity type and a second impurity region of a second conductivity type provided above the first impurity region; and each of the well potential fixing parts includes an impurity region of the second conductivity type whose density is higher than the second impurity region.

* * * * *